(12) United States Patent
Funabashi

(10) Patent No.: US 11,774,850 B2
(45) Date of Patent: Oct. 3, 2023

(54) METHOD FOR DISPOSING SUBSTRATE AND METHOD FOR MANUFACTURING ARTICLE

(71) Applicant: CANON KABUSHIKI KAISHA, Tokyo (JP)

(72) Inventor: Naoki Funabashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/062,214

(22) Filed: Oct. 2, 2020

(65) Prior Publication Data
US 2021/0033967 A1    Feb. 4, 2021

Related U.S. Application Data

(62) Division of application No. 15/607,154, filed on May 26, 2017, now abandoned.

(30) Foreign Application Priority Data

Jun. 1, 2016    (JP) .................................. 2016-109653

(51) Int. Cl.
  *G03F 7/00*   (2006.01)
  *G03F 9/00*   (2006.01)
  (Continued)

(52) U.S. Cl.
  CPC .......... *G03F 7/0002* (2013.01); *G03F 9/7042* (2013.01); *G03F 9/7076* (2013.01);
  (Continued)

(58) Field of Classification Search
  CPC .. G03F 7/0002; G03F 7/7085; G03F 7/70241; G03F 7/70716; G03F 9/7042;
  (Continued)

(56) References Cited

U.S. PATENT DOCUMENTS 6,117,598 A  *  9/2000  Imai ...................... G03F 9/7026
                                                    430/30
6,160,619 A  * 12/2000  Magome ................. G02B 1/04
                                                    356/508
(Continued)

FOREIGN PATENT DOCUMENTS

EP    1811337 A2    7/2007
JP    62-169327 A    7/1987
(Continued)

*Primary Examiner* — Seyed Masoud Malekzadeh
(74) *Attorney, Agent, or Firm* — Canon U.S.A., Inc., IP Division

(57) ABSTRACT

A method of disposing a substrate on a holding unit using a pattern forming apparatus which forms a pattern on the substrate, the pattern forming apparatus comprising: a stage, the holding unit removably attached to the stage and configured to suck and hold the substrate, an optical system, and configured to detect an alignment mark of the substrate from a suction surface side of the substrate, the optical system having plural optical elements, and a detection unit configured to detect a reference mark for measuring a position of a detection field of the optical system, the method comprising: detecting a position of the reference mark, and disposing the substrate on the holding unit using the detected position of the reference mark so that the alignment mark of the substrate detected from the suction surface side of the substrate by the optical system is disposed in the detection field.

13 Claims, 9 Drawing Sheets

(51) Int. Cl.
*H01L 21/67* (2006.01)
*H01L 21/68* (2006.01)

(52) U.S. Cl.
CPC .......... *G03F 9/7084* (2013.01); *G03F 9/7088* (2013.01); *H01L 21/6715* (2013.01); *H01L 21/681* (2013.01)

(58) Field of Classification Search
CPC .... G03F 9/7076; G03F 9/7084; G03F 9/7088; G03F 9/7003; G03F 9/7073; H01L 21/6715; H01L 21/681
See application file for complete search history.

(56) References Cited

U.S. PATENT DOCUMENTS

| | | | | |
|---|---|---|---|---|
| 6,455,214 | B1* | 9/2002 | Wakamoto | G03F 9/7003 430/30 |
| 6,486,955 | B1* | 11/2002 | Nishi | G01B 9/02018 356/500 |
| 6,768,539 | B2* | 7/2004 | Gui | G03F 9/7084 355/53 |
| 7,501,215 | B2* | 3/2009 | Best | G03F 9/7088 430/311 |
| 7,745,237 | B2* | 6/2010 | Katagiri | G03F 9/7088 264/408 |
| 8,235,695 | B2* | 8/2012 | Kiuchi | G03F 9/7003 425/506 |
| 8,319,940 | B2* | 11/2012 | Butler | G03F 9/7015 355/75 |
| 9,400,436 | B2* | 7/2016 | Maeda | G03F 7/70641 |
| 9,573,319 | B2* | 2/2017 | Okushima | G03F 9/7042 |
| 10,948,829 | B2* | 3/2021 | Funabashi | G03F 9/7073 |
| 2001/0055117 | A1* | 12/2001 | Mizutani | G03F 9/7011 356/401 |
| 2002/0014601 | A1* | 2/2002 | Yoshida | G03F 9/7092 250/548 |
| 2002/0037460 | A1* | 3/2002 | Takahashi | G03F 7/70716 430/30 |
| 2002/0109825 | A1* | 8/2002 | Gui | G03F 7/70216 250/548 |
| 2003/0020889 | A1* | 1/2003 | Takahashi | G03F 7/70716 430/30 |
| 2003/0064307 | A1* | 4/2003 | Nakamura | G03F 9/7084 430/30 |
| 2003/0224262 | A1* | 12/2003 | Lof | G03F 9/7084 430/394 |
| 2004/0022888 | A1* | 2/2004 | Sreenivasan | B82Y 40/00 425/810 |
| 2004/0036850 | A1* | 2/2004 | Tsukamoto | G03F 7/707 355/75 |
| 2004/0090607 | A1* | 5/2004 | Yoshida | G03F 9/7084 250/548 |
| 2004/0136494 | A1* | 7/2004 | Lof | G03F 9/7034 378/34 |
| 2004/0189964 | A1* | 9/2004 | Nijmeijer | G03F 9/7026 355/55 |
| 2006/0077367 | A1* | 4/2006 | Kobayashi | G03F 7/7085 355/53 |
| 2006/0126038 | A1* | 6/2006 | Hoogendam | G01B 11/14 355/53 |
| 2006/0170891 | A1* | 8/2006 | Nishinaga | G03F 7/7015 355/53 |
| 2006/0187431 | A1* | 8/2006 | Shibazaki | G03F 7/70716 355/53 |
| 2006/0187432 | A1* | 8/2006 | Yasuda | G03F 9/7088 355/53 |
| 2007/0109517 | A1* | 5/2007 | Takaiwa | G03F 7/70341 355/53 |
| 2007/0177125 | A1* | 8/2007 | Shibazaki | G03F 7/707 355/72 |
| 2007/0234786 | A1* | 10/2007 | Moon | G03F 9/7038 356/501 |
| 2007/0252960 | A1* | 11/2007 | Kida | G03F 7/2041 355/53 |
| 2008/0013089 | A1* | 1/2008 | Ishii | G03F 9/7011 356/400 |
| 2009/0316122 | A1* | 12/2009 | Prosyentsov | G03F 7/7085 355/30 |
| 2010/0110434 | A1* | 5/2010 | Choi | G03F 9/7084 356/401 |
| 2011/0129782 | A1* | 6/2011 | Gosen | G03F 7/70341 355/30 |
| 2011/0149258 | A1* | 6/2011 | Gosen | G03F 7/70341 355/77 |
| 2011/0290136 | A1* | 12/2011 | Koga | G03F 9/7003 101/481 |
| 2012/0328725 | A1* | 12/2012 | Minoda | G03F 7/0002 425/150 |
| 2013/0134616 | A1* | 5/2013 | Sato | B82Y 10/00 425/149 |
| 2013/0230798 | A1* | 9/2013 | Maeda | G03F 7/70641 430/30 |
| 2014/0049763 | A1* | 2/2014 | Miyakawa | G03F 7/70716 355/72 |
| 2015/0015861 | A1* | 1/2015 | Sentoku | G03F 7/70516 355/77 |
| 2015/0028506 | A1* | 1/2015 | Sato | G03F 7/0002 425/150 |
| 2015/0049317 | A1* | 2/2015 | Mishima | G03F 7/70141 355/67 |
| 2015/0062553 | A1* | 3/2015 | Miyaharu | G03F 9/7042 355/72 |
| 2015/0116688 | A1* | 4/2015 | Endo | G03F 9/7003 355/72 |
| 2015/0192515 | A1* | 7/2015 | Iwai | G03F 9/7088 355/53 |
| 2015/0235880 | A1* | 8/2015 | Inada | G06K 9/00 348/87 |
| 2015/0343679 | A1* | 12/2015 | Morohoshi | B29C 43/58 425/110 |
| 2016/0009020 | A1* | 1/2016 | Takakuwa | G03F 7/0002 264/293 |
| 2016/0075076 | A1* | 3/2016 | Sato | G03F 7/0002 264/40.5 |
| 2017/0040196 | A1* | 2/2017 | Takakuwa | G03F 9/7038 |
| 2017/0151694 | A1* | 6/2017 | Sato | G03F 9/7042 |
| 2019/0086797 | A1* | 3/2019 | Hirano | B29C 59/02 |

FOREIGN PATENT DOCUMENTS

| | | |
|---|---|---|
| JP | 2013-247304 A | 12/2013 |
| KR | 2007-0085211 A | 8/2007 |

\* cited by examiner

METHOD FOR DISPOSING SUBSTRATE AND METHOD FOR MANUFACTURING ARTICLE

CROSS-REFERENCE TO RELATED APPLICATION

This application is a Divisional of U.S. application Ser. No. 15/607,154, filed May 26, 2017, now abandoned, which claims priority from Japanese Patent Application No. 2016-109653 filed Jun. 1, 2016, which are hereby incorporated by reference herein in their entireties.

BACKGROUND OF THE INVENTION

Field of the Invention

The invention relates to a pattern forming apparatus, a method for disposing a substrate, and a method for manufacturing an article.

Description of the Related Art

When a device (e.g., a semiconductor device, a liquid crystal display device, and a thin film magnetic head) is manufactured using a photolithographic process, an exposure apparatus which projects a mask pattern on a substrate, such as a wafer, by a projection optical system, and transfers the pattern is used.

In recent years, an exposure apparatus is used to manufacture not only IC chips, such as memory and logic, but multilayer devices employing a penetration via process, such as Micro Electro Mechanical Systems (MEMS) and a CMOS image sensor (CIS). In the manufacture of these devices, fine line width resolution and overlay precision are not required whereas a greater focus depth is required as compared with the manufacture of a related art IC chip.

In an exposure apparatus, a process of exposing a front surface of a substrate is performed based on an alignment mark formed on a back surface (a surface to be sucked by a chuck) of the substrate (e.g., an Si wafer). This process is needed to form a penetration via from the front surface of the substrate to make a circuit on the front surface be connected with a circuit on the back surface of the substrate, for example. Therefore, technical support to detection of an alignment mark formed on the back surface of the substrate (hereinafter, "back surface alignment") is becoming important recently. Especially in an exposure process to expose the front surface of the substrate based on an alignment mark formed on the back surface of the substrate, overlay inspection of an alignment mark formed on the front surface of the substrate and an alignment mark formed on the back surface is needed.

As back surface alignment, a technology to provide an optical system for the detection of alignment marks on a back surface (a substrate stage) of a substrate is proposed (see Japanese Patent Laid-Open No. 2002-280299). Japanese Patent Laid-Open No. 2002-280299 describes observing an alignment mark from the substrate stage side using the optical system for the detection of alignment marks provided on the substrate stage, and detecting an image of the alignment mark.

If the optical system for the detection of alignment marks is provided on the substrate stage as described in Japanese Patent Laid-Open No. 2002-280299, only alignment marks on the substrate located in a detection field of the optical system for the detection of alignment marks are detectable. A chuck for sucking a substrate is disposed on the substrate stage, and the chuck is replaceable. When the chuck for sucking the substrate is detached and another chuck is disposed on the substrate stage, there is a possibility of misalignment of the chuck disposed on the substrate stage. Misalignment of the chuck may cause misalignment of the optical system for the detection of alignment marks provided integrally with the chuck, whereby the detection field of the optical system for the detection of alignment marks is moved. Therefore, the detection field of the optical system for the detection of alignment marks and the alignment mark on the substrate are misaligned with each other, and it becomes difficult to detect the alignment mark of the substrate from the substrate stage side.

SUMMARY OF THE INVENTION

According to an aspect of the invention, a method of disposing a substrate on a holding unit using a pattern forming apparatus which forms a pattern on the substrate, the pattern forming apparatus comprising: a stage which is movable, the holding unit removably attached to the stage and configured to suck and hold the substrate, an optical system of which position with respect to the holding unit is fixed, and configured to detect an alignment mark of the substrate from a suction surface side of the substrate sucked by the holding unit, the optical system having plural optical elements, and a detection unit configured to detect a reference mark for measuring a position of a detection field of the optical system, the method comprising: detecting a position of the reference mark, and disposing the substrate on the holding unit using the detected position of the reference mark so that the alignment mark of the substrate detected from the suction surface side of the substrate by the optical system is disposed in the detection field of the optical system.

According to another aspect of the invention, a method of disposing a substrate on a substrate holding apparatus comprising a holding unit configured to suck and hold the substrate, an optical system of which position with respect to the holding unit is fixed, and configured to detect an alignment mark of the substrate which is sucked by the holding unit from a suction surface side of the substrate, the optical system having plural optical elements, and a reference mark for measuring a detection field of the optical system, and the method comprising: detecting a position of the reference mark, and disposing the substrate on the holding unit using the detected position of the reference mark so that the alignment mark of the substrate detected from the suction surface side of the substrate by the optical system is disposed in the detection field of the optical system.

Further features of the present invention will become apparent from the following description of exemplary embodiments with reference to the attached drawings.

DESCRIPTION OF THE EMBODIMENTS

Hereinafter, embodiments of the invention are described with reference to the attached drawings.

Figure 1:
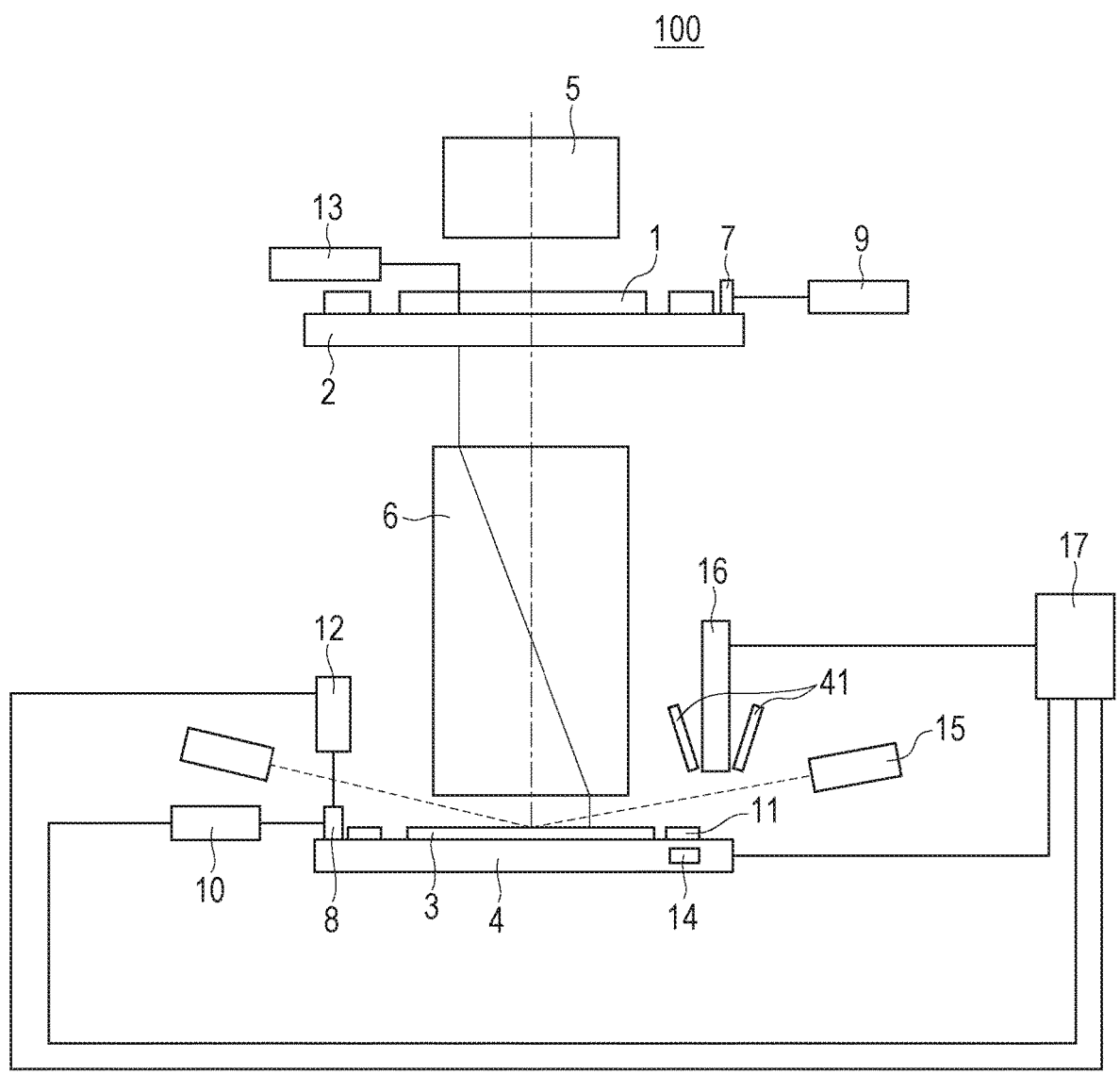
FIG. 1 schematically illustrates an exposure apparatus.

FIG. 1 schematically illustrates a configuration of an exposure apparatus 100 as an aspect of the present embodiment. The exposure apparatus 100 is an example of a lithography apparatus (a pattern forming apparatus) which forms a pattern on a substrate. The exposure apparatus 100 includes a mask stage 2 which holds a mask (a reticle) 1, a substrate stage 4 which holds a substrate 3, and an illumination optical system 5 which illuminates the mask 1 held on the mask stage 2. The exposure apparatus 100 further includes a projection optical system 6 which projects an image of a pattern of the mask 1 on the substrate 3 held on the substrate stage 4, and a control unit (a computer) 17 which collectively controls an operation of the entire exposure apparatus 100.

In the present embodiment, the exposure apparatus 100 is a scanning exposure apparatus (a scanner) which transfers the pattern of the mask 1 to the substrate 3, while scanning the mask 1 and the substrate 3 in synchronization in a scanning direction (a step-and-scan system). The exposure apparatus 100 may be an exposure apparatus (a stepper) which projects a pattern of the mask 1 on the substrate 3 with the mask 1 fixed (a step-and-repeat system).

Hereinafter, a direction coincident with an optical axis of the projection optical system 6 (an optical axis direction) is defined as a Z-axis direction, a scanning direction of the mask 1 and the substrate 3 in a plane orthogonal to the Z-axis direction is defined as a Y-axis direction, and a direction orthogonal to the Z-axis direction and the Y-axis direction (a non-scanning direction) is defined as an X-axis direction. Rotational directions about the X-axis, the Y-axis, and the Z-axis are defined as a θX direction, a θY direction, and a θZ direction, respectively.

The illumination optical system 5 illuminates the mask 1, specifically, a predetermined illumination region on the mask 1, with light (exposure light) of uniform illuminance distribution. The exposure light may be, for example, g-line (wavelength: about 436 nm) and i-line (wavelength: about 365 nm) of an extra high-pressure mercury lamp, KrF excimer laser (wavelength: about 248 nm), ArF excimer laser (wavelength: about 143 nm), F2 laser (wavelength: about 157 nm), etc. In order to manufacture a finer semiconductor device, extreme ultraviolet (EUV) light with wavelengths of several nanometers to several hundreds of nanometers may be used as exposure light.

The mask stage 2 is movable two-dimensionally in a plane orthogonal to the optical axis of the projection optical system 6, i.e., an XY plane, and is rotatable in the θZ direction. The mask stage 2 is driven with 1-axis or 6-axes by a driving apparatus (not illustrated), such as a linear motor.

A mirror 7 is disposed in the mask stage 2. A laser interferometer 9 is disposed to face the mirror 7. A position and a rotation angle of the mask stage 2 in a two-dimensional direction are measured in real time by the laser interferometer 9, and measurement results are output to a control unit 17. The control unit 17 controls the driving apparatus of the mask stage 2 in accordance with the measurement results of the laser interferometer 9, and positions the mask 1 held on the mask stage 2.

The projection optical system 6 includes a plurality of optical devices, and projects the pattern of the mask 1 on the substrate 3 at predetermined projecting magnification β. A photosensitive agent (resist) is applied to the substrate 3, and when an image of the pattern of the mask 1 is projected on the photosensitive agent, a latent image pattern is formed on the photosensitive agent. In the present embodiment, the projection optical system 6 is a reduction optical system which has ¼ or ⅕ as the projecting magnification β, for example.

The substrate stage 4 includes a Z stage for holding the substrate 3 via a chuck which sucks and holds the substrate 3, an XY stage for supporting the Z stage, and a base for supporting the XY stage. The substrate stage 4 is driven by a driving apparatus, such as a linear motor. The chuck which sucks and holds the substrate 3 is detachable from and attachable to the substrate stage 4.

A mirror 8 is disposed in the substrate stage 4. Laser interferometers 10 and 12 are disposed to face the mirror 8. A position of the substrate stage 4 in the X-axis direction, the Y-axis direction, and the θZ direction are measured in real time by the laser interferometer 10, and measurement results are output to the control unit 17. Similarly, a position of the substrate stage 4 in the Z-axis direction and a position of the substrate stage 4 in the θX direction and the θY direction are measured in real time by the laser interferometer 12, and measurement results are output to the control unit 17. The control unit 17 controls the driving apparatus of the substrate stage 4 in accordance with the measurement results of the laser interferometers 10 and 12, and positions the substrate 3 held on the substrate stage 4.

A mask alignment detection system 13 is disposed near the mask stage 2. The mask alignment detection system 13 detects a mask reference mark (not illustrated) on the mask 1 held on the mask stage 2, and a reference mark 39 on a stage reference plate 11 disposed on the substrate stage 4 via the projection optical system 6.

The mask alignment detection system 13 illuminates the mask reference mark on the mask 1 and the reference mark 39 via the projection optical system 6 using the same light source as the light source used when actually exposing the substrate 3. The mask alignment detection system 13 detects reflected light from the mask reference mark and the reference mark 39 by an image sensor (e.g., a photoelectric conversion device, such as a CCD camera). In accordance with detection signals from the image sensor, alignment between the mask 1 and the substrate 3 is performed. By aligning the position and the focus between the mask reference mark on the mask 1 and the reference mark 39 on the stage reference plate 11, a relative positional relationship (X, Y, Z) between the mask 1 and the substrate 3 can be aligned.

A mask alignment detection system 14 is disposed on the substrate stage 4. The mask alignment detection system 14 is a transmissive detection system, and used when the reference mark 39 is a transmissive mark. The mask alignment detection system 14 illuminates the mask reference mark on the mask 1 and the reference mark 39 using the same light source as the light source used when actually exposing the substrate 3, and detects transmitted light through the marks by a light quantity sensor. The mask alignment detection system 14 detects a light amount of the transmitted light through the reference marks, while moving the substrate stage 4 in the X-axis direction (or the Y-axis direction) and in the Z-axis direction. Therefore, the position and the focus between the mask reference mark on the mask 1 and the reference mark 39 on the stage reference plate 11 can be aligned with each other. As described above, the relative positional relationship (X, Y, Z) between the mask 1 and the substrate 3 can be aligned whichever of the mask alignment detection system 13 or the mask alignment detection system 14 is used.

The stage reference plate 11 is disposed at a corner of the substrate stage 4 so that a front surface of the stage reference plate 11 is substantially the same height as that of a front surface of the substrate 3. The stage reference plate 11 may be disposed at one of the corners or at a plurality of corners of the substrate stage 4.

Figure 2:
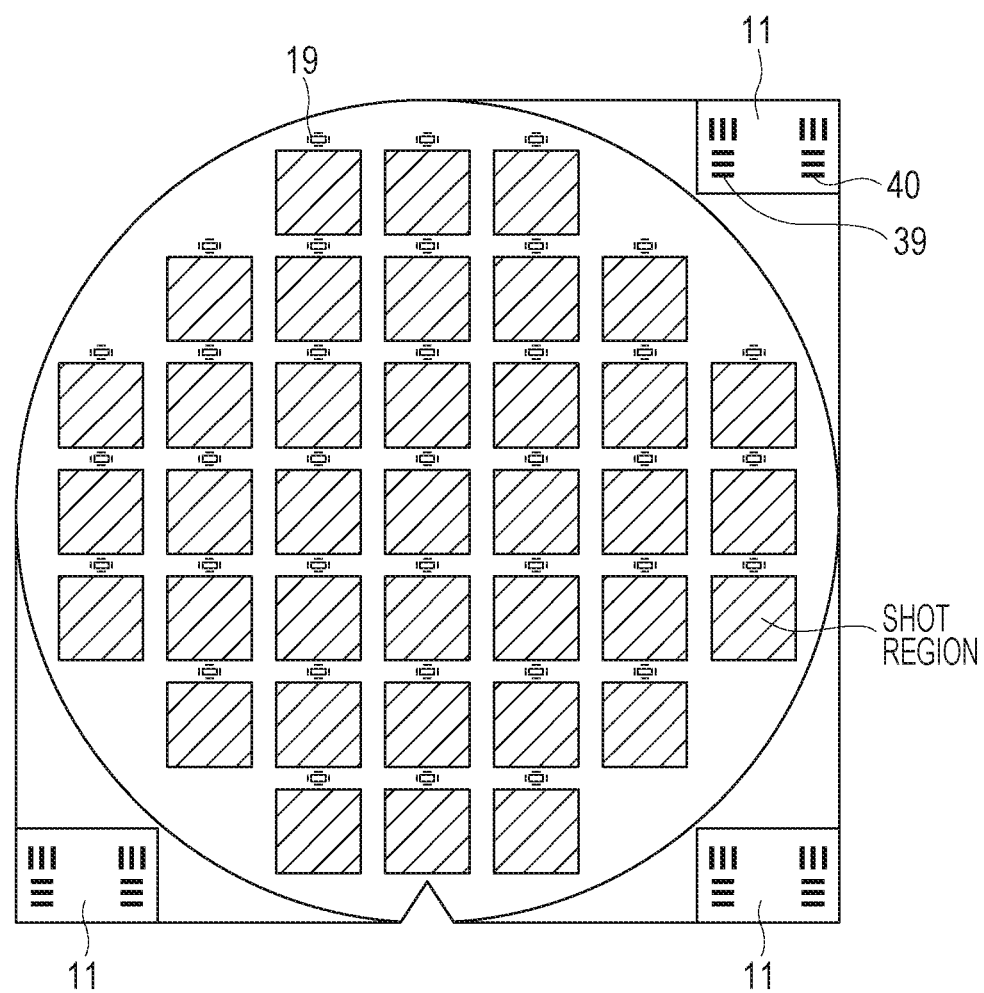
FIG. 2 is a plan view of a substrate and a substrate stage.

As illustrated in FIG. 2, the stage reference plate 11 includes the reference mark 39 to be detected by the mask alignment detection system 13 or 14, and a reference mark 40 to be detected by the substrate alignment detection system 16. FIG. 2 is a plan view of a wafer 3 and a wafer stage 4 seen from the Z direction. The stage reference plate 11 may include a plurality of reference marks 39 and a plurality of reference marks 40. Positional relationships between the reference mark 39 and the reference mark 40 (in the X-axis direction and in the Y-axis direction) is set to be a predetermined positional relationship (that is, known). The reference mark 39 and the reference mark 40 may be the same mark. As illustrated in FIG. 2, marks for alignment are formed on scribe lines between shot regions on the wafer 3.

A focus detection system 15 includes a projection system which projects light on the front surface of the substrate 3, and a light receiving system which receives light reflected on the front surface of the substrate 3, detects a position of the substrate 3 in the Z-axis direction, and outputs a detection result to the control unit 17. The control unit 17 controls the driving apparatus which drives the substrate stage 4 in accordance with the detection result of the focus detection system 15, and adjusts a position and an inclination angle in the Z-axis direction of the substrate 3 held on the substrate stage 4.

A substrate alignment detection system 16 includes an optical system, such as an illumination system which illuminates a mark, and an image formation system which forms an image of a mark with light from the mark. The substrate alignment detection system 16 detects various marks, such as an alignment mark formed on the substrate 3, and the reference mark 40 on the stage reference plate 11, and outputs the detection result to the control unit 17. The control unit 17 controls the driving apparatus which drives the substrate stage 4 in accordance with the detection result of the substrate alignment detection system 16, and adjusts a position of the substrate 3 held on the substrate stage 4 in the X-axis direction and in the Y-axis direction or the rotation angle of the θZ direction.

The substrate alignment detection system 16 includes a focus detection system for a substrate alignment detection system (an AF detection system) 41. The AF detection system 41 includes a projection system which projects light on the front surface of the substrate 3 and a light receiving system which receives light reflected on the front surface of the substrate 3 as the focus detection system 15 does. The focus detection system 15 is used for focusing of the projection optical system 6, whereas the AF detection system 41 is used for focusing of the substrate alignment detection system 16.

Generally, a configuration of a detection system which detects a mark on the substrate is divided roughly into two: an off-axis alignment (OA) detection system, and a Through the Lens Alignment (TTL) detection system. The OA detection system optically detects an alignment mark formed on the substrate not via the projection optical system. The TTL detection system detects an alignment mark formed on the substrate using light with a wavelength different from a wavelength of the exposure light (i.e., non-exposure light) via the projection optical system. Although the substrate alignment detection system 16 is the OA detection system in the present embodiment, the alignment detection system is not limited to the same. For example, if the substrate alignment detection system 16 is the TTL detection system, the alignment mark formed on the substrate is detected via the projection optical system 6, but a basic configuration is the same as that of the OA detection system.

Figure 3:
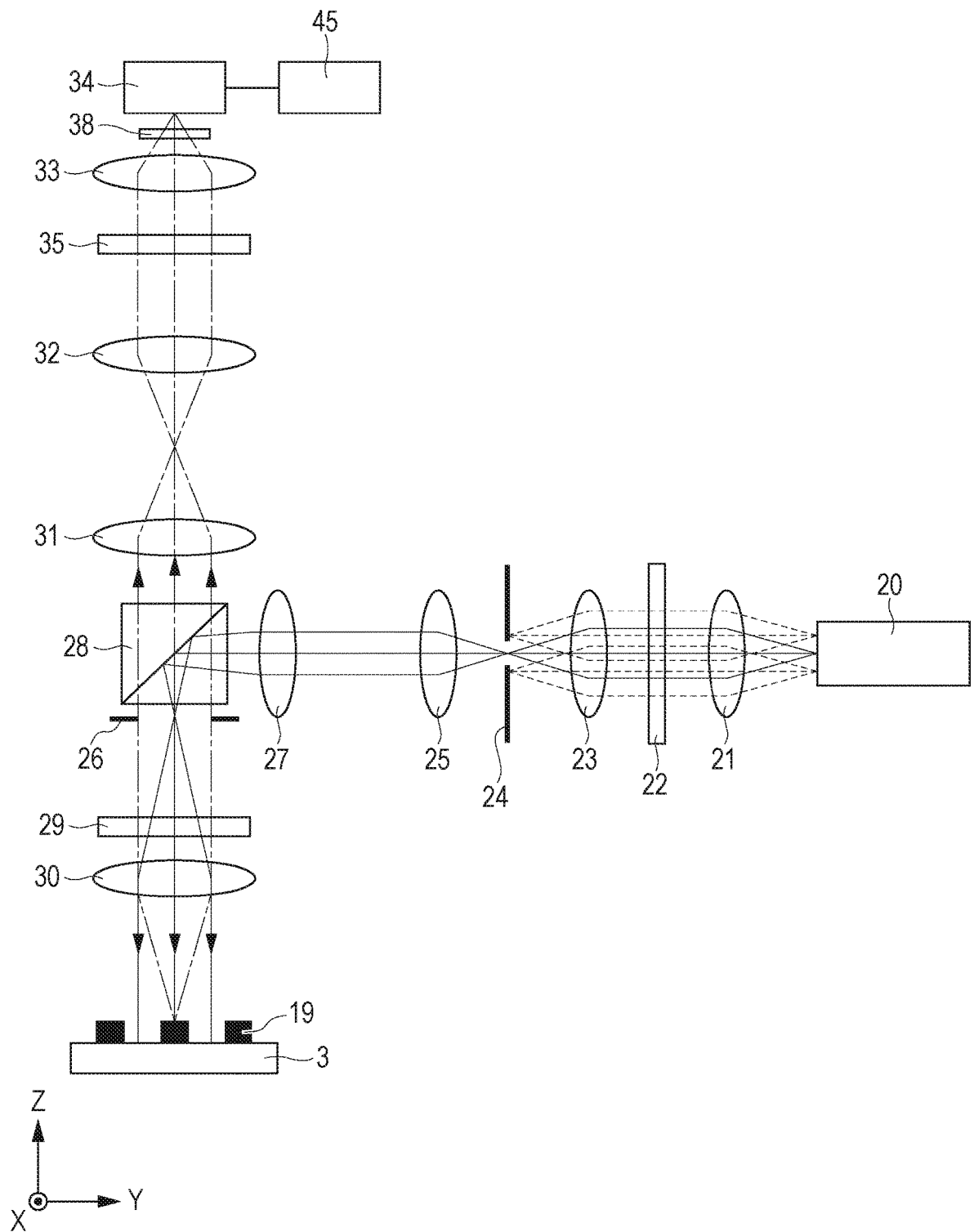
FIG. 3 schematically illustrates a substrate alignment detection system.

The substrate alignment detection system 16 is described in detail with reference to FIG. 3. FIG. 3 schematically illustrates a specific configuration of the substrate alignment detection system 16. The substrate alignment detection system 16 functions as a detecting unit which detects various marks. For example, the substrate alignment detection system 16 detects an alignment mark (a first mark) formed on a front surface (a first surface) of the substrate 3, and also detects an alignment mark (a second mark) formed on a back surface (a second surface on the opposite side of the first surface) of the substrate 3. The back surface of the substrate is a surface on a suction surface side of the substrate to be sucked by the chuck which sucks and holds the substrate. The front surface of the substrate is a surface opposite to the suction surface of the substrate and to which the photosensitive agent for pattern formation is applied. As described later, the substrate alignment detection system 16 detects a reference mark formed in the chuck. For the ease of description, in FIG. 3, an example in which the substrate alignment detection system 16 detects an alignment mark 19 formed on the front surface of the substrate 3 illustrated in FIG. 2 (hereinafter, a "front surface side mark") is described. The substrate 3 here is a Si wafer.

A light source 20 emits visible light (e.g., wavelength: 400 nm to 800 nm) as light with a wavelength which does not penetrate the substrate 3, and infrared light (e.g., wavelength: 800 nm to 1500 nm) as light with a wavelength which penetrates the substrate 3. The light from the light source 20 passes through a first relay optical system 21, a wavelength filter plate 22, and a second relay optical system 23, and reaches an aperture diaphragm 24 located on a pupil plane (an optical Fourier transformation plane to an object surface) of the substrate alignment detection system 16.

A plurality of filters transmitting different wavelength ranges of light are disposed in the wavelength filter plate 22. Under the control of the control unit 17, one of the filters is selected and disposed on an optical path of the substrate alignment detection system 16. In the present embodiment, a filter transmitting visible light and a filter transmitting infrared light are disposed in the wavelength filter plate 22. By changing these filters, the mark is illuminated with light of either of the visible light and the infrared light. Additional filter may be included in the wavelength filter plate 22.

As the aperture diaphragm 24, a plurality of aperture diaphragms with different illumination σ (opening diameters) are disposed. Illumination σ of light which illuminates the mark can be changed by switching the aperture diaphragms disposed on the optical path of the substrate alignment detection system 16 under the control of the control unit 17. Additional aperture diaphragm may be included as the aperture diaphragm 24.

Light which reached the aperture diaphragm 24 is guided to a polarization beam splitter 28 via a first illumination system 25 and a second illumination system 27. S-polarized light orthogonal to the drawing plane of light guided to the polarization beam splitter 28 is reflected by the polarization beam splitter 28, penetrates an NA diaphragm 26 and a λ/4 plate 29, and is converted into circularly polarized light. Light penetrated the λ/4 plate 29 passes an objective lens 30, and illuminates the front surface side mark 19 formed on the substrate 3. The NA diaphragm 26 can change the NA by changing a diaphragm amount under the control of the control unit 17.

Reflected light, diffracted light, and scattered light from the front surface side mark 19 pass the objective lens 30, penetrate the λ/4 plate 29, are converted into P-polarized light parallel to the drawing plane, and penetrate the polarization beam splitter 28 via the NA diaphragm 26. Light penetrated the polarization beam splitter 28 forms an image of the front surface side mark 19 on a photoelectric conversion device (e.g., a sensor, such as a CCD) 34 via a relay lens 31, a first image formation system 32, an optical member for coma aberration adjustment 35, and a second image formation system 33. The photoelectric conversion device 34 captures (detects) an image of the front surface side mark 19 and acquires a detection signal. If an image of the alignment mark formed on the back surface of the substrate is formed on the photoelectric conversion device 34, the photoelectric conversion device 34 captures the image of the alignment mark and acquires the detection signal.

Upon detection of the front surface side mark 19 on the substrate 3 by the substrate alignment detection system 16, since resist (a transparent layer) is applied (formed) on the front surface side mark 19, interference fringe may be caused in monochromatic light or light in narrow wavelength ranges. Therefore, a signal of the interference fringe is added to the detection signal from the photoelectric conversion device 34, whereby the front surface side mark 19 cannot be detected with high accuracy. Then, addition of the signal of the interference fringe to the detection signal from the photoelectric conversion device 34 is reduced generally by using a light source which emits light in wide wavelength ranges as the light source 20.

A processing unit 45 obtains a position of a mark in accordance with an image of a mark captured by the photoelectric conversion device 34. However, the control unit 17 or an external control device may have the function of the processing unit 45.

FIRST EMBODIMENT

As a method for detecting an alignment mark on a substrate, an example in which the mark is illuminated and detected from a front surface side of the substrate has been described. In the present embodiment, an example in which a mark is illuminated and detected from a back surface side of a substrate.

Figure 4:
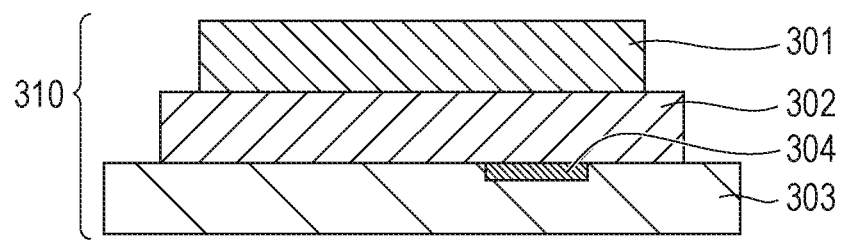
FIG. 4 is a cross-sectional view of the substrate.

First, the substrate on which an alignment mark to be detected is formed is described. In the present embodiment, as illustrated in FIG. 4, an example in which an alignment mark 304 is formed inside of a laminated substrate 310 is described. FIG. 4 is a schematic cross-sectional view of the substrate 310. In the substrate 310, an intermediate layer 302 formed by a material which does not easily transmit infrared light, such as a metal layer or a highly doped layer, is formed between a first wafer 301 and a second wafer 303. The alignment mark 304 is formed on the second wafer 303, and an undersurface of the second wafer 303 is sucked by the chuck. The alignment mark 304 on the second wafer 303 is used for a process of aligning the substrate 310 based on a detected position of the alignment mark 304 and forming a pattern on the first wafer 301.

Figure 5:
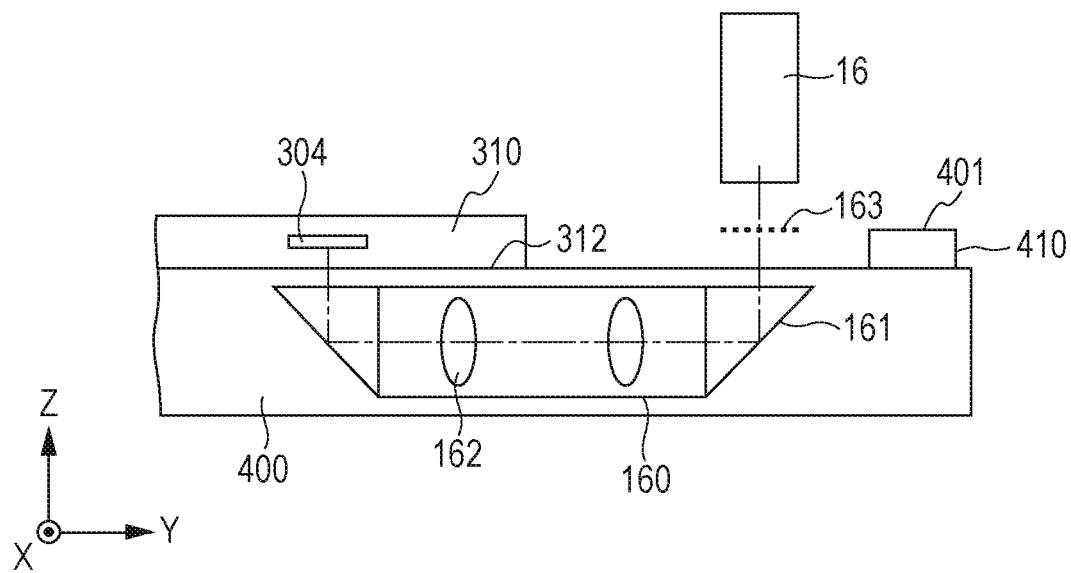
FIG. 5 illustrates a configuration of an optical system.

Since the intermediate layer 302 does not easily transmit infrared light, it is difficult to detect the alignment mark 304 from the first wafer 301 side using the infrared light. Then, in the present embodiment, the alignment mark 304 is detected from the second wafer 303 side. FIG. 5 illustrates an optical system 160 for detecting the alignment mark 304 from the second wafer 303 side. FIG. 5 is a cross-sectional view of a configuration which includes the optical system 160. A position of the optical system 160 is fixed inside of a chuck 400 (a holding portion) which sucks and holds the substrate. The optical system 160 is integrated with the chuck 400. The optical system 160 is constituted by a mirror 161 which reflects the illumination light from the substrate alignment detection system 16, a lens which guides the light reflected by the mirror 161 to the substrate 310, and a lens barrel etc. The optical system 160 is a relay (focus) optical system which illuminates the alignment mark 304 of the substrate 310 using illumination light from the substrate alignment detection system 16, and forms an image of the alignment mark 304 on an image surface 163 at a position distant from the substrate 310. The substrate alignment detection system 16 detects an image of the alignment mark 304 formed on the image surface 163, and obtains the position of the alignment mark 304. A height of the image surface 163 in the Z direction can be arbitrarily changed by a design change. Therefore, a range of the height of the image surface 163 which changes depending on a thickness and a mark position of the substrate (the wafer) may be set within a driving range of the substrate stage 4 in the Z direction.

Since a light source of the illumination light and a photoelectric conversion device are provided in the substrate alignment detection system 16, and the relay optical system is formed in the optical system 160, heat deformation of the chuck 400 is avoided and weight of the chuck 400 is reduced. A wavelength of the illumination light is desirably a wavelength of infrared light which penetrates silicon of 1000 nm or thicker, for example. If a position of the alignment mark 304 in the substrate 310 is changed, that is, if a distance from a suction surface 312 of the substrate 310 by the chuck 400 to the alignment mark 304 changes, the position of the image surface 163 changes. Therefore, the substrate stage 4 is moved in the Z direction so that the image surface 163 is disposed in a focus depth detectable by the substrate alignment detection system 16 depending on the distance from the suction surface 312 to the alignment mark 304.

In the present embodiment, a detection (observation) field of the optical system 160 is about 91 mm in consideration of position measurement accuracy of the mark and the magnitude of the optical system, and magnification of the optical system 160 is 1. The position measurement accuracy is about 500 nm. For example, if the optical system 160 is a magnification reduction system, the observation field is expanded, whereas measurement accuracy is reduced. If the lens diameter of the optical system 160 is further increased, the observation field is expanded, but there is restriction of space in the chuck 400.

Figure 6:
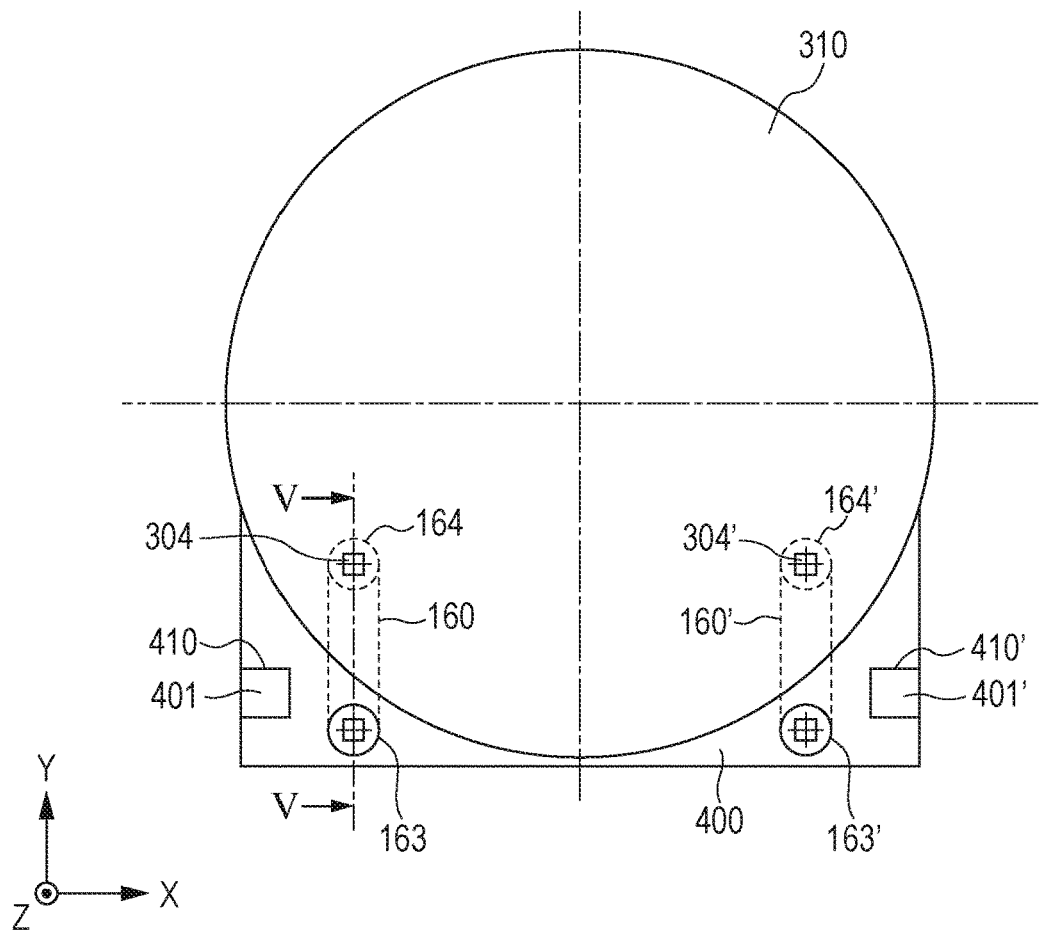
FIG. 6 illustrates the substrate and a chuck.

FIG. 6 is a top view of the chuck 400 seen from the Z direction. FIG. 6 illustrates a state where the chuck 400 is sucking the substrate 310. Other than the optical system 160 illustrated by a dotted line, an optical system 160' is provided in the chuck 400 at a position shifted in the X direction from the optical system 160. The optical system 160' and the optical system 160 are the same in configuration. FIG. 5 is a cross-sectional view of the optical system 160 along line V-V of FIG. 6. The optical system 160 illuminates the alignment mark 304 within an observation field (a detection field) 164, and forms an image of the alignment mark 304 on the image surface 163. Other than the alignment mark 304, an alignment mark 304' is provided on the substrate 310 at a position shifted from the alignment mark 304 in the X direction. The optical system 160' illuminates the alignment mark 304' within an observation field 164' and forms an image of the alignment mark 304' on the image surface 163'. Therefore, the position of the substrate 310 in the X and the Y directions, and a rotation angle (a rotational position) θ about the Z-axis with respect to the center position of the substrate can be measured using the optical system 160 and the optical system 160'. The observation fields 164 and 164' of the optical systems 160 and 160' are disposed such that their positions in the Y direction are the same when disposed on the substrate stage 4 with the chuck 400 not being misaligned. Since the optical system 160 and the optical system 160' are the same in configuration (optical path length), the image surfaces 163 and 163' are also disposed such that their positions in the Y direction are the same when disposed on the substrate stage 4 with the chuck 400 not being misaligned.

It is necessary to design the mark detectable in the observation fields of the optical systems 160 and 160' in a shot layout when exposing the substrate 310 (the wafer 303). The center position of the observation field of each of the optical systems 160 and 160' is set to be (−67.20, −35.50) and (67.20, −35.50), respectively, with the center of the substrate 310 being (X, Y)=(0, 0). The reason for the same image height in the Y direction is to decrease restrictions in the X direction when disposing the shot layout. For example, by serially disposing a plurality of marks at positions of Y=−35.50 at intervals of 1 mm, the marks can reliably be measured in the observation fields of the optical systems 160 and 160'. Alternatively, it is possible to specify coordinates and dispose the marks to be detectable in the observation field at the positions of (−67.20, −35.50) and (67.20, −35.50). In order to detect a rotation angle θ about the Z-axis, at least 2 marks are required. The image height of the observation field may be Y=0 or X=0, or may be arbitrarily determined.

The chuck 400 is attached to and detached from the substrate stage 4. The chuck 400 is replaced with another chuck in accordance with the substrate to be sucked, or for the maintenance. The image height of the observation field of the optical system 160 (the position in the X and Y directions) is fixed with respect to the chuck 400. Therefore, if the shot layout of the substrate 310 sucked by the chuck 400 and the position of the alignment mark are changed, there is a possibility that the alignment mark cannot be detected by the optical system 160. In that case, the chuck is detached and replaced by a new chuck having a different position of observation field of the optical system 160 than that of the detached chuck. That is, the chuck is replaced depending on the shot layout of the substrate 310 sucked by the chuck 400 and the position of the alignment mark, so that the image height of the observation field of the optical system 160 is changed. In case of soiling or damaging of the optical system 160, the entire chuck 400 in which the optical system 160 is provided can be replaced easily.

The exposure apparatus 100 includes a chuck replacement mechanism (not illustrated) for carrying in and out the chuck 400. When carrying the chuck out, after turning off sucking force of the chuck (vacuum-sucking force on the substrate stage 4), the chuck is raised by the chuck replacement mechanism and removed from the substrate stage 4. When carrying the chuck in, the chuck replacement mechanism moves the chuck onto the substrate stage 4, and positions by fitting two or more positioning pins projecting from the substrate stage 4 into positioning holes provided in the chuck. Then, suction force of the chuck is turned on and the chuck is fixed onto the substrate stage 4. By forming the positioning holes provided in the chuck to be large relative to the positioning pins to leave gap therebetween, the positioning pins on the substrate stage 4 can easily be fitted in the positioning holes on the chuck. However, if the gap is excessively large, a positioning error of the chuck on the substrate stage 4 becomes larger, and the chuck greatly rotates in the θ rotation, for example, whereby the observation field of the optical system 160 is moved from the predetermined position. If the observation field of the optical system 160 is moved from the predetermined position, when the substrate 310 is disposed on the chuck 400 at a predetermined position, there is a possibility that the alignment mark 304 on the substrate 310 cannot be detected.

Then, in the present embodiment, as illustrated in FIGS. 5 and 6, reference marks 401 and 401' for measuring the position of the detection field of the optical system 160 are fixedly provided at predetermined positions on the chuck 400. The reference mark 401 is provided on a mark plate 410 fixed on the chuck 400. The reference mark 401' is provided on a mark plate 410' fixed on the chuck 400. A reference mark may desirably have a two-dimensional feature in order to measure the position thereof in the X and Y directions. For example, a reference mark may have a shape of a two-by-two-matrix and a plus (+) sign, which have a width in both the X and Y directions. The reference mark 401 and the reference mark 401' may desirably be provided at positions as far as possible from the center position (a point of intersection drawn by one-dot chain lines of FIG. 6) of the chuck (the substrate arrangement area) for the calculation of the rotation angle θ of the chuck 400 with higher precision. FIG. 6 illustrates an example in which the reference mark 401 and the reference mark 401' are disposed near the outermost edge in the X direction of the chuck 400. The reference marks 401 and 401' may be disposed so that their positions in the Y direction are the same when disposed on the substrate stage 4 with the chuck 400 not being misaligned.

Figure 7:
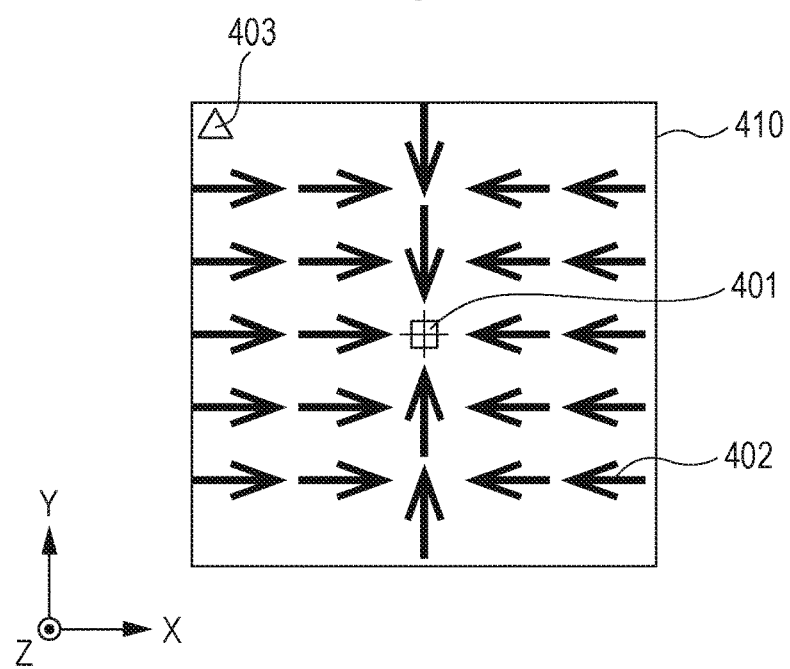
FIG. 7 illustrates a reference mark.

FIG. 7 illustrates an example of the mark plate 410 on which the reference mark 401 is provided. Arrow marks 402 etc. indicating the position of the reference mark 401 for the search of the reference mark 401, for example, are formed in the mark plate 410 to make it easy to detect the position of the reference mark 401. The magnitude of the mark plate 410 is □3 mm in the X and Y directions, and is set to be greater than an arrangement error which may be caused when the chuck 400 is disposed on the substrate stage 4, for example. Therefore, also if the chuck 400 is replaced, the reference mark 401 can be detected reliably. In case of soiling or damaging of the reference mark 401, another type of mark 403 may be disposed additionally.

The reference mark 401 may include at least two separately disposed marks in order to measure the rotation angle about the Z-axis of the entire chuck 400 with respect to the center position of the chuck 400. As illustrated in FIG. 6, the chuck 400 includes the reference marks 401 and 401' at each of the two members, but two marks may be formed on a single member, for example. The reference marks 401 and 401' are detected by the substrate alignment detection system 16. The substrate alignment detection system 16 moves the substrate stage 4, sequentially detects the reference mark 401 and the reference mark 401', and measures the position of each reference mark. The substrate alignment detection system 16 then obtains the position of the chuck 400 based on the center position of the chuck obtained in advance, relative positions (design values etc.) between the reference marks 401 and 401', and the positions of the measured reference marks 401 and 401'. Specifically, the substrate alignment detection system 16 obtains the position of the chuck 400 in the X and Y directions and a rotation angle θc about the Z-axis with respect to the center position of the chuck as the position of the chuck 400. Since the optical systems 160 and 160' are fixed to the predetermined position with respect to the reference mark (the chuck 400), the positions of the observation fields of the optical systems 160 and 160' can be obtained based on information about those predetermined positions and the positions of the measured reference marks. That is, obtaining the position of the chuck 400 based on the positions of the measured reference marks 401 and 401' are equivalent to obtaining the positions of observation fields of the optical systems 160 and 160'.

A relative positional relationship between the reference marks 401 and 401' and the observation fields of the optical systems 160 and 160' may be determined using design values or may be measured in advance. If the relative positional relationship is measured, a tool substrate of which relative position between the mark on the chuck suction surface (the back surface) side and the mark on the opposite side (the front surface side) is known is used, for example. The tool substrate is sucked at the chuck 400, the back surface side marks are detected using the optical systems 160 and 160', and the positions of the back surface side marks with respect to the center position of the detection field of each of the optical systems 160 and 160' are obtained. Next, the positions of the front surface side marks are obtained by detecting the front surface side marks using the substrate alignment detection system 16. Therefore, the center position of the detection field of each of the optical systems 160 of 160' in a coordinate system of the substrate stage 4 can be obtained based on the obtained these positions and the relative positions between the back surface side mark and the front surface side mark. The positions of the reference marks 401 and 401' are detected using the substrate alignment detection system 16. Therefore, the relative positions between the reference marks 401 and 401' and the observation fields of the optical systems 160 and 160' can be measured.

Figure 8:
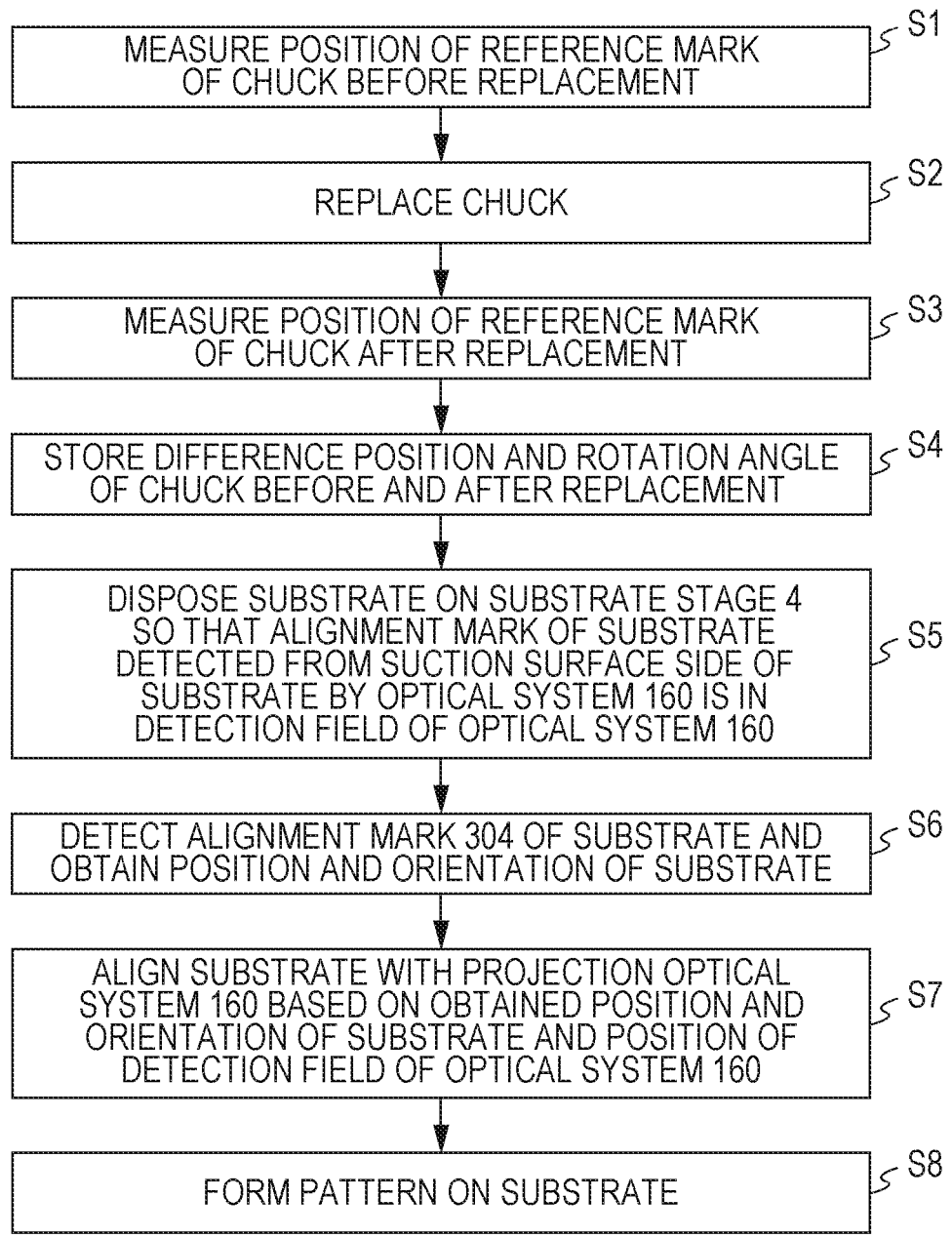
FIG. 8 is a flowchart of replacement and alignment of the chuck.

A method from the replacement of the chuck in which the substrate is sucked and held until the substrate is aligned and exposed is described with reference to the flowchart of FIG. 8. First, a baseline is measured as pre-adjustment of the apparatus. Specifically, the mask alignment detection system 13 detects the reference mark 39 on the stage reference plate 11 disposed on the substrate stage 4 via the projection optical system 6. Further, the reference mark 39 on the stage reference plate 11 is detected using the substrate alignment detection system 16. From the two detected positions, a distance between optical axes (a baseline) between the mask alignment detection system 13 (the projection optical system 6) and the substrate alignment detection system 16 is obtained.

In S1, the positions of the reference marks 401 and 401' before replacement of the chuck are measured using the substrate alignment detection system 16 (S1). Specifically, the substrate alignment detection system 16 detects the reference marks 401 and 401', and measures the center position of each of the reference marks 401 and 401'. The position is measured using the coordinate system of the substrate stage 4. The position of the chuck before replacement in the X and Y directions, and the rotation angle θ about the Z-axis with respect to the center position of the chuck before replacement can be obtained from the positions of the measured reference marks. Next, the chuck is replaced by another chuck using the chuck replacement mechanism (S2). After the replacement of the chuck, an arrangement error of the chuck on the substrate stage 4 may occur as described above. Therefore, the positions of the reference marks 401 and 401' of the chuck after replacement is measured using the substrate alignment detection system 16 (S3). The measuring method is the same as that of S1. The position in the X and Y directions of the chuck after replacement and the rotation angle θ about the Z-axis with respect to the center position of chuck after replacement can be obtained from the positions of the measured reference marks. A difference in position of the chucks in the X and Y directions and a difference in rotation angle about the Z-axis before and after replacement are stored in memory (a storage unit) of the control unit 17 (S4). Alternatively, measurement positions of the reference marks before and after replacement may be stored. Since the relative position between the reference marks 401 and 401' and the observation fields of the optical systems 160 and 160' is known as described above, the positions of the observation fields of the optical systems 160 and 160' can be obtained from the positions of the reference marks measured in S3. If the difference in rotation angle of the reference mark before and after replacement of the chuck is larger than a driving range of the rotation angle about the Z-axis of the substrate stage 4, the rotation angle about the Z-axis of the chuck may be adjusted and the chuck may re-disposed on the substrate stage. In a case where the chuck is disposed for the first time on the substrate stage, or where position information about the reference mark of chuck disposed previous time is not obtained, the position of the chuck after replacement and information about the rotation angle may desirably be stored in memory in S4 without performing S1 and S2.

Figure 9A:
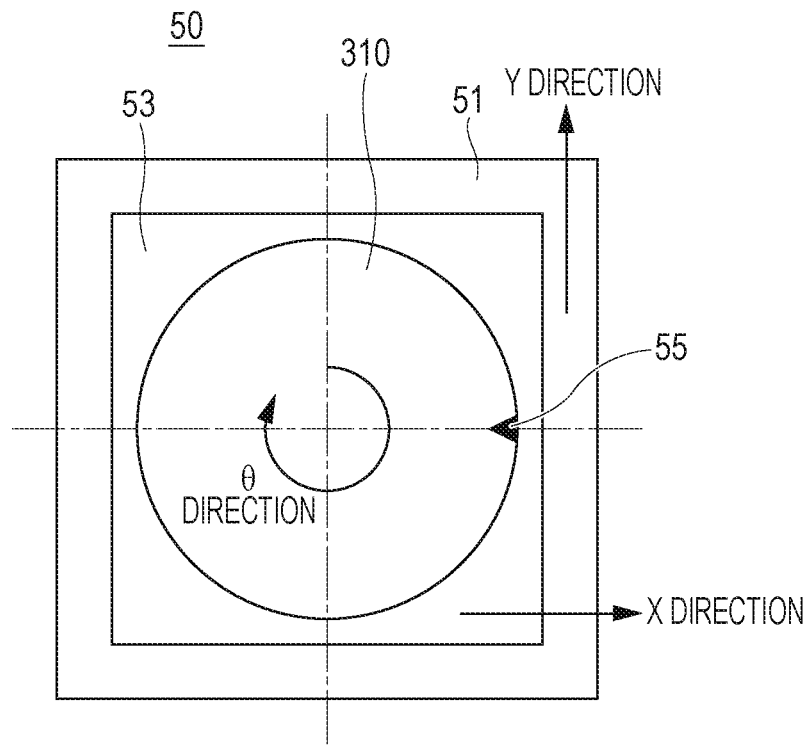
FIGS. 9A and 9B schematically illustrate a prealignment detector.
Figure 9B:
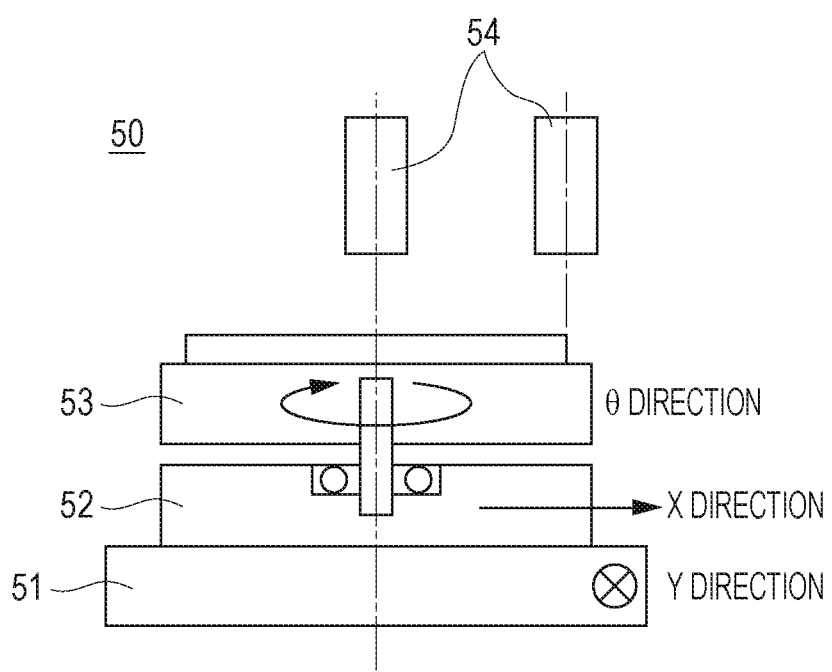
Figure 10:
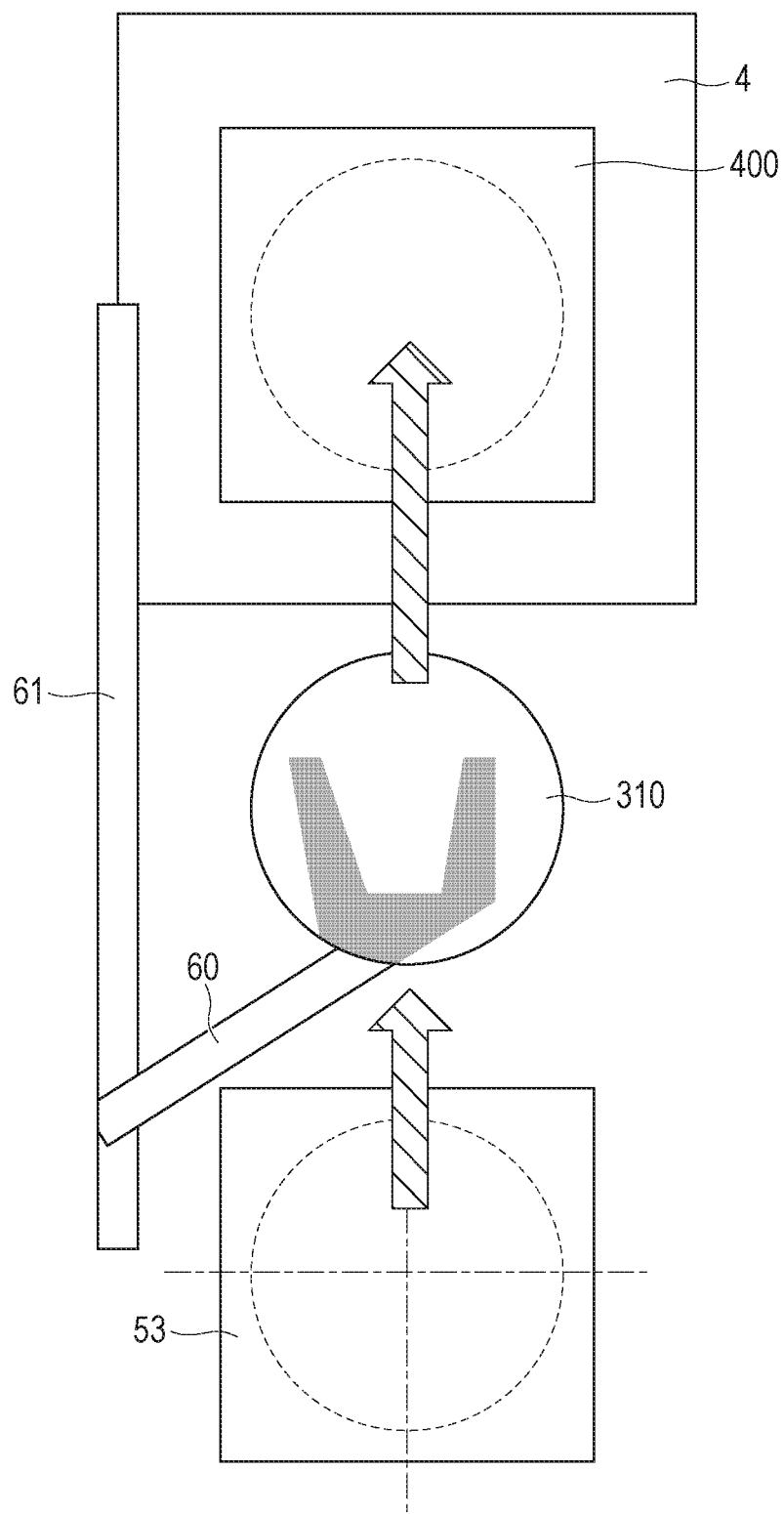
FIG. 10 illustrates a configuration of a conveyance hand.

The exposure apparatus 100 includes a prealignment (PA) detector 50 (a prealignment detecting unit) which holds the substrate and measures the center position of the substrate. FIGS. 9A and 9B illustrate the PA detector 50. The PA detector 50 includes a stage 51 which moves the substrate in the Y direction, a stage 52 which moves the substrate in the X direction, and a stage 53 which drives the substrate to rotate on the XY plane. The PA detector 50 further includes a plurality of cameras 54 (measurement units) capable of detecting an outer periphery of the substrate, a notch 55, or an orientation flat, and an unillustrated processing unit (a computer) which calculates the position of the substrate based on the information detected by the cameras 54. In the PA detector 50, the center position of the substrate 310 on the XY plane is calculated. Specifically, first of all, in order to detect positional misalignment of the substrate 310, the PA detector 50 rotates the substrate 360 degrees about the Z-axis and observes a shape of the outer periphery of the substrate with the cameras 54. An ideal center position of the substrate is calculated by the processing unit based on the shape of the outer periphery of the substrate. The position of the substrate in the rotational direction can also be measured about the substrate which has the notch 55 or the orientation flat. FIG. 10 illustrates a configuration of a conveyance hand 60 (a conveyance unit) which conveys the substrate. When conveying the substrate, the conveyance hand 60 enters below the substrate 310 on the stage 53 of the PA detector 50. At this time, sucking force of the substrate 310 by the stage 53 of the PA detector 50 is lowered in advance, and the state 53 is moved upward from a state where the conveyance hand 60 is lowered in the Z direction to a position where the conveyance hand 60 touches the substrate 310 in the Z direction. The conveyance hand 60 also includes a sucking mechanism and, after the suction of the substrate 310 is performed by the conveyance hand 60, the conveyance hand 60 is further moved in the Z direction. Then, the conveyance hand 60 can move the substrate 310 to the position of the substrate stage 4 along a guide 61.

After S4, the substrate is disposed on the substrate stage 4 from the PA detector 50 so that the alignment mark on the substrate detected from the suction surface side of the substrate by the optical systems 160 and 160' is disposed in the detection fields of the optical systems 160 and 160' (S5). The substrate is disposed on the substrate stage 4 in accordance with the positions of the reference marks 401 and 401' measured in S3. For example, when the substrate is moved to the substrate stage 4 by the conveyance hand 60, in a state where the conveyance hand 60 holds the substrate, the position of the substrate stage 4 in the X and Y directions and the rotation angle of the substrate stage 4 about the Z-axis are corrected using a difference in the position or the rotation angle stored in the memory in S4 as offsets. Alternatively, if a conveyance hand with a degree of freedom of three or more axes is used, in a position control system of the conveyance hand, the position of the conveyance hand may be corrected by inputting the difference in position and the difference in rotation angle stored in the memory in S4 as offsets. Alternatively, after obtaining the center position of the substrate by the PA detector, on the stage of the PA detector, the position of the substrate in the X and Y directions and the rotation angle about the Z-axis of the substrate are changed by the difference in position or the difference in rotation angle stored in the memory in S4. Then, the conveyance hand may move the substrate from the PA detector to the substrate stage 4. Alternatively, the position and the angle of the chuck 400 on the substrate stage 4 (the detection fields of the optical systems 160 and 160') may be adjusted. These correcting methods may be combined. A correction amount of the rotation angle about the Z-axis is desirably set as small as possible from an angle aligned with the coordinate system of the substrate stage 4 using the PA detector. This is because, if the rotation angle of the substrate exceeds an angle driving range of the substrate stage 4 upon exposure while correcting the rotation angle about the Z-axis in the coordinate system of the substrate stage 4, an operation to correct the rotation of the substrate is needed. Specifically, the substrate is held by a pin and only the substrate stage is rotated, and rotation of the substrate is corrected. This process lowers the throughput. Therefore, when disposing the alignment mark on the substrate in the observation field 164 of the optical system 160, the correction amount of the rotation angle about the Z-axis may desirably be as small as possible.

The substrate stage 4 includes an unillustrated lifting mechanism of the chuck and a suction pin which projects when the chuck is moved downward. Before the substrate is handed to the substrate stage 4, the chuck is moved downward by the lifting mechanism and the suction pin projects. The conveyance hand is moved downward in the Z direction, and suction force of the conveyance hand is lowered before the substrate touches the suction pin. The conveyance hand is further moved downward, the substrate is sucked by the suction pin, and the substrate is handed. The conveyance hand then retracts in the horizontal direction and is separated from the substrate stage 4. In the substrate stage 4, after checking that the conveyance hand has moved, the chuck is moved upward by the lifting mechanism. Before the substrate touches the sucking mechanism of the chuck, suction of the suction pin is lowered. The chuck is moved upward, the substrate is sucked by the chuck, and the substrate is handed to the chuck.

As described above, the alignment mark on the substrate detected from the suction surface side of the substrate by the optical systems 160 and 160' can enter the detection fields of the optical systems 160 and 160', whereby a detection error of the alignment mark can be eliminated. Further, re-disposing of the substrate or replacement or re-disposing of the chuck due to a detection error become unnecessary, which improves the throughput.

Figure 11:
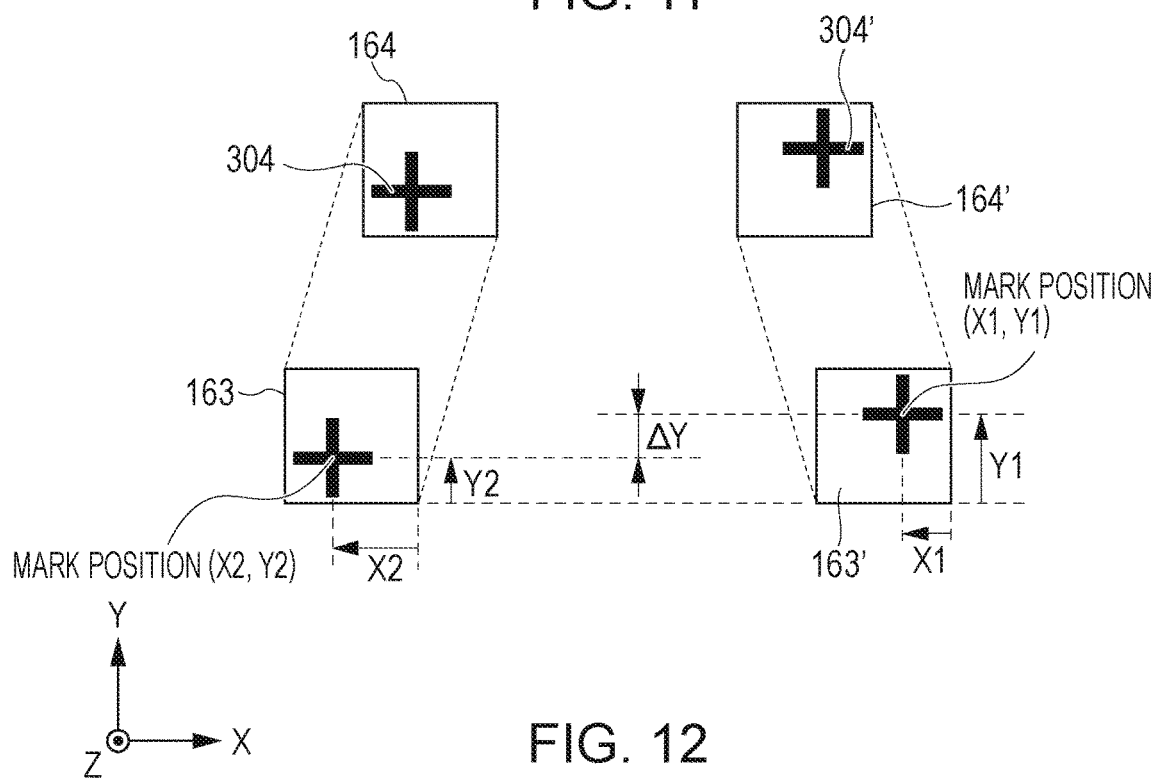
FIG. 11 illustrates detection of alignment marks.

Next, the alignment marks 304 and 304' of the substrate 310 in the detection fields of the optical systems 160 and 160' are detected. The position of the substrate in the X and Y directions and the rotation angle (the orientation) about the Z-axis of the substrate are obtained based on the positions of the detected alignment marks 304 and 304' (S6). Detection of the alignment marks 304 and 304' is described with reference to FIG. 11. The positions of the alignment marks 304 and 304' are measured using the optical systems 160 and 160' and the substrate alignment detection system 16. The positions of the alignment marks 304 and 304' obtained by measurement based on the position reference of the photoelectric conversion device 34 of the substrate alignment detection system 16 are defined as (X1, Y1) and (X2, Y2). The rotation angle $\theta$ about the Z-axis of the substrate is calculated by dividing (Y2−Y1=$\Delta$Y) by a distance between observation fields of the optical system 160 and the optical system 160'. Regarding correction of the rotation angle about the Z-axis of the substrate, in the coordinate system of the substrate stage 4, it is necessary to subtract rotation misalignment $\theta$c of the chuck 400 based on the reference mark from the calculated rotation angle $\theta$ to calculate a rotation angle correction amount with respect to an actual movement amount of the substrate stage 4. FIG. 11 illustrates a case where no rotation misalignment $\theta$c of the chuck 400 exists based on the reference mark. If rotation misalignment $\theta$c of the chuck 400 based on the reference mark exists, the positions of the observation fields 164 and 164' are shifted, and the image surfaces 163 and 163' are also shifted accordingly.

Next, alignment of the substrate is performed in accordance with the position and orientation of the substrate obtained in S6 and the position of the observation field of the optical systems 160 and 160' (the chuck) obtained from the reference mark position measured in S3. Specifically, about the position of the substrate in the X and Y directions and the rotation angle about the Z-axis of the substrate, alignment is performed with respect to the projection optical system (the coordinate system of the substrate stage 4) (S7). Then, the exposure apparatus 100 projects an image of the pattern of the mask 1 on the photosensitive agent applied to the front surface of the substrate 310, that is, on the wafer 301, and forms a latent image pattern on the photosensitive agent (S8). In S7, since the pattern is formed on the substrate after performing alignment of the substrate, overlay precision of the pattern on the back side of the substrate and the pattern on front side can be increased.

ALTERNATIVE EMBODIMENT

Figure 12:
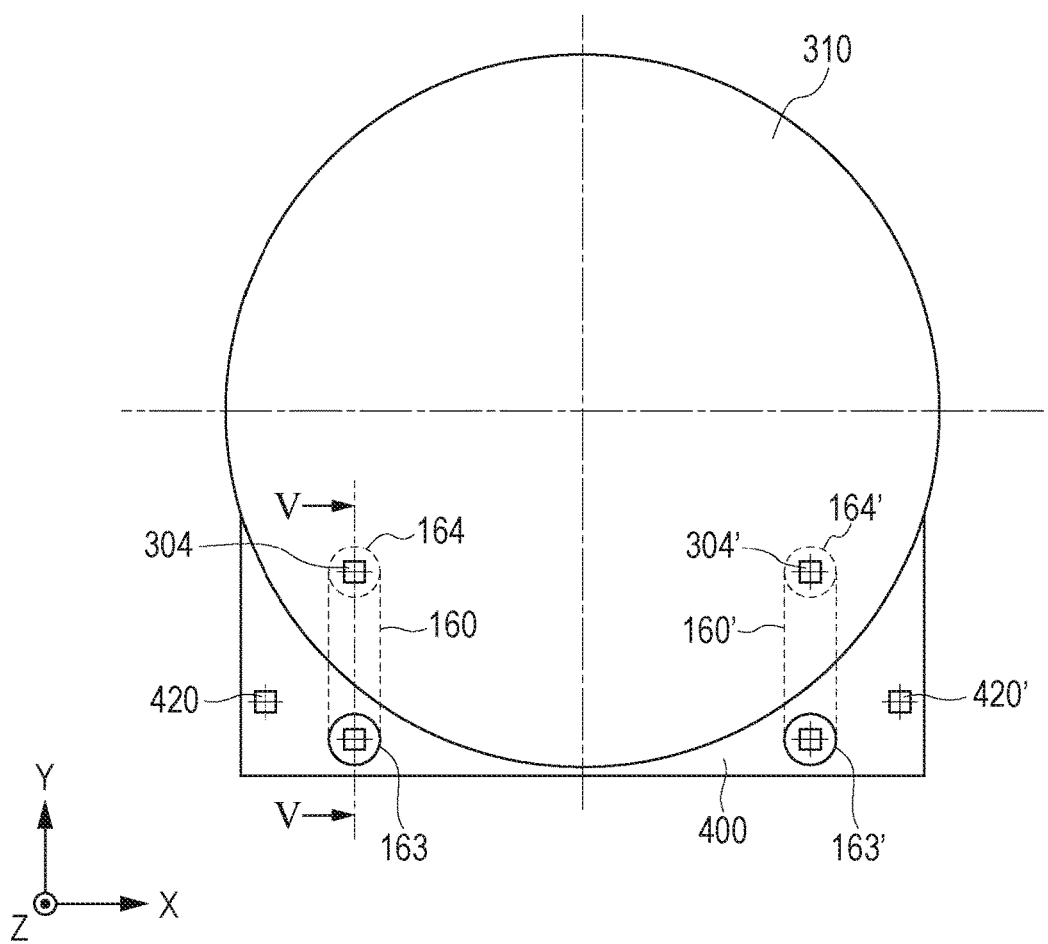
FIG. 12 illustrates an alternative embodiment of the reference marks.

Instead of providing the reference marks 401 and 401' on the mark plate 410, marks 420 and 420' formed on a surface of a member which constitutes the chuck 400 may be employed as illustrated in FIG. 12. In that case, it is necessary to keep a stroke in the Z direction of the substrate stage 4 so that the substrate alignment detection system 16 can focus on the surface of the chuck 400.

Without providing the reference marks 401 and 401', in S3, the center position of the detection field of each of the optical systems 160 and 160' may be obtained using the above-described tool substrate without detection of the reference marks 401 and 401'. In this case, a tool substrate of which the relative position between the mark on a chuck suction surface (the back surface) side and the mark on the opposite side (the front surface side) is used as described above. The tool substrate is made to suck at the chuck 400, detects the back surface side mark using the optical systems 160 and 160', and obtains the position of the back surface side mark with respect to the center position of the detection field of each of the optical systems 160 and 160'. Next, the position of the front surface side mark is obtained by detecting the front surface side mark using the substrate alignment detection system 16. Therefore, the center position of the detection field of each of the optical systems 160 and 160' in the coordinate system of the substrate stage 4 can be obtained based on the obtained these positions and the relative position of the back surface side mark and the front surface side mark.

The position of the alignment mark 304 on the substrate surface may vary depending on the shot layout and the type of the substrate (the device). Therefore, the observation fields of the optical systems 160 and 160' may be constituted to be movable in the chuck 400, and the alignment mark 304 may be detected by moving the observation fields of the optical systems 160 and 160'. With this configuration, an alignment mark of an arbitrary image height on the substrate surface can be detected, and it is not necessary to replace the chuck 400 for each different shot layouts and different types of the substrates (different positions of alignment marks).

The substrate is not limited to the substrate 310. An alignment mark may be formed on the back surface of the substrate, that is, a surface which faces the suction surface 312 of chuck 400 which sucks the substrate 310. In that case, since it is not necessary that light which illuminates the alignment mark by the optical system 160 penetrates the substrate, such as silicon, the light does not necessarily have to have an infrared wavelength.

The apparatus to which the chuck 400 is applied is not limited to the exposure apparatus, and may be a lithography apparatus, such as a drawing apparatus and an imprint device. Here, the drawing apparatus is a lithography apparatus which draws a substrate with a charged particle beam (an electron beam, an ion beam, etc.), and the imprint device is a lithography apparatus which forms an imprint material (resin etc.) on the substrate by molding and forms a pattern on the substrate. The substrate is not limited to an Si wafer, and may be made of silicon carbide (SiC), sapphire, dopant Si, glass substrate, etc.

Method for Manufacturing Article

Next, a method for manufacturing an article which employs the above-described lithography apparatus (a semiconductor IC device, a liquid crystal display device, etc.) is described. The method includes a process of forming a pattern on a substrate (a wafer, a glass plate, a film substrate, etc.) using the above-described lithography apparatus, and a process of processing (etching etc.) the substrate on which the pattern is formed. The method of manufacturing an article according to the present embodiment is advantageous in at least one of performance, quality, productivity and production cost of the article as compared with those of the related art method. The above-described lithography apparatus provides an article, such as a device of high quality (a semiconductor integrated circuit device, a liquid crystal display device, etc.) with high throughput and more economically.

Various embodiments of the present invention have been described, but these are illustrative only. Modifications and changes may be made without departing from the scope of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of disposing a substrate on a holding unit using a pattern forming apparatus which forms a pattern on the substrate, the pattern forming apparatus comprising:

a stage which is movable, the holding unit removably attached to the stage and configured to suck and hold the substrate, an optical system fixed inside the holding unit, and configured to detect an alignment mark of the substrate sucked by the holding unit, the optical system having plural optical elements, and a detection unit configured to detect a reference mark located on the holding unit, the method comprising:

detecting a position of the reference mark, obtaining a position of a detection field of the optical system based on the detected position of the reference mark, and after the obtaining of the position of the detection field, disposing the substrate on the holding unit so that the alignment mark of the substrate detected from a suction surface side of the substrate by the optical system is disposed in the detection field of the optical system.

2. The method for disposing according to claim 1, wherein after replacing the holding unit, the reference mark is detected, and the substrate is disposed on the holding unit in accordance with a detected position of the reference mark.

3. The method for disposing according to claim 1, wherein the substrate is disposed on the holding unit in accordance with the detected position of the reference mark so that the alignment mark of the substrate detected from the suction surface side of the substrate by the optical system is disposed in the detection field of the optical system.

4. The method for disposing according to claim 1, wherein the substrate is disposed on the holding unit by controlling a conveyance unit which conveys the substrate in accordance with the detected position of the reference mark detected by the detection system so that the alignment mark of the substrate detected from the suction surface side of the substrate by the optical system is disposed in the detection field of the optical system.

5. The method for disposing according to claim 1, wherein, after adjusting a position or an angle of the substrate by controlling a stage of a prealignment detecting unit including a stage which holds the substrate and a measurement unit which measures a position of the substrate, the substrate is conveyed from the prealignment detecting unit to the holding unit and the substrate is disposed on the holding unit.

6. A method for manufacturing an article, comprising:
disposing a substrate on a holding unit using the method according to claim 1;
forming a pattern on the substrate disposed on the holding unit; and
manufacturing an article by processing the substrate in which the pattern is formed.

7. A method of disposing a substrate on a substrate holding apparatus comprising a holding unit configured to suck and hold the substrate, an optical system fixed inside the holding unit, and configured to detect an alignment mark of the substrate which is sucked by the holding unit, the optical system having plural optical elements, and a reference mark located on the holding unit, and the method comprising:
detecting a position of the reference mark,
obtaining a position of a detection field of the optical system based on the detected position of the reference mark, and
after the obtaining of the position of the detection field, disposing the substrate on the holding so that the alignment mark of the substrate detected from a suction surface side of the substrate by the optical system is disposed in the detection field of the optical system.

8. The method for disposing according to claim 7, wherein
the substrate holding apparatus is removably attached to a stage;
after replacing the substrate holding apparatus on the stage, the reference mark is detected, and
the substrate is disposed on the holding unit in accordance with a detected position of the reference mark.

9. The method for disposing according to claim 7, wherein the substrate is disposed on the holding unit by controlling a stage on which the substrate holding apparatus is arranged in accordance with the detected position of the reference mark so that the alignment mark of the substrate detected from the suction surface side of the substrate by the optical system is disposed in the detection field of the optical system.

10. The method for disposing according to claim 7, wherein the substrate is disposed on the holding unit by controlling a conveyance unit which conveys the substrate in accordance with the detected position of the reference mark so that the alignment mark of the substrate detected from the suction surface side of the substrate by the optical system is disposed in the detection field of the optical system.

11. The method for disposing according to claim 7, wherein, after adjusting a position or an angle of the substrate by controlling a stage of a prealignment detecting unit including the stage which holds the substrate and a measurement unit which measures a position of the substrate, the substrate is disposed on the holding unit by conveying the substrate from the prealignment detecting unit to the holding unit.

12. The method for disposing according to claim 7, further comprising:
detecting positions of a plurality of alignment marks of the substrate on the holding unit using the optical system; and
obtaining a position and an angle of the substrate based on the detected position of the plurality of alignment marks of the substrate.

13. A method for manufacturing an article, comprising:
disposing a substrate on a holding unit using the method according to claim 7;
forming a pattern on the substrate disposed on the holding unit; and
manufacturing an article by processing the substrate in which the pattern is formed.

* * * * *